(12) United States Patent
Jin

(10) Patent No.: US 8,045,379 B2
(45) Date of Patent: Oct. 25, 2011

(54) SEMICONDUCTOR DEVICE THAT IS ADVANTAGEOUS IN OPERATIONAL ENVIRONMENT AT HIGH TEMPERATURES

(75) Inventor: Zhengwu Jin, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 542 days.

(21) Appl. No.: 12/191,060

(22) Filed: Aug. 13, 2008

(65) Prior Publication Data

US 2008/0315316 A1    Dec. 25, 2008

Related U.S. Application Data

(62) Division of application No. 11/481,251, filed on Jul. 6, 2006, now Pat. No. 7,420,840.

(30) Foreign Application Priority Data

Aug. 30, 2005    (JP) ................................ 2005-249752

(51) Int. Cl.
    *G11C 16/04*    (2006.01)
(52) U.S. Cl. ......... 365/185.05; 365/185.26; 365/185.27; 365/185.28
(58) Field of Classification Search ............. 365/185.05, 365/185.26, 185.27, 185.28
    See application file for complete search history.

(56) References Cited

U.S. PATENT DOCUMENTS

| 4,717,944 A * | 1/1988 | Van de Wiel et al. ......... 257/365 |
| 5,840,604 A * | 11/1998 | Yoo et al. ...................... 438/230 |
| 6,091,121 A | 7/2000 | Oda |
| 6,903,978 B1 | 6/2005 | Mirgorodski et al. |
| 6,903,979 B1 * | 6/2005 | Mirgorodski et al. ... 365/185.28 |
| 7,105,394 B2 | 9/2006 | Hachimine et al. |
| 7,420,840 B2 * | 9/2008 | Jin ........................... 365/185.05 |
| 2003/0181005 A1 | 9/2003 | Hachimine et al. |
| 2006/0157741 A1 | 7/2006 | Jin |
| 2009/0078970 A1 * | 3/2009 | Yamazaki et al. ............ 257/255 |

FOREIGN PATENT DOCUMENTS

| JP | 07-135208 A | 5/1995 |
| JP | 08-321612 A | 12/1996 |
| JP | 11-145464 A | 5/1999 |
| JP | 2001-028341 A | 1/2001 |
| JP | 2003-273240 A | 9/2003 |
| JP | 2004-63591 A | 2/2004 |
| JP | 2006-202853 A | 8/2006 |
| WO | WO 02/43151 A1 | 5/2002 |
| WO | WO 2004/090992 A2 | 10/2004 |

OTHER PUBLICATIONS

H. Choosuwan et al. "Negative thermal expansion behavior in single crystal and ceramic of $Nb_2O_5$-based compositions", Journal of Applied Physics, Apr. 15, 2002, vol. 91, No. 8, pp. 5051-5054.

(Continued)

*Primary Examiner* — Pho M Luu
(74) *Attorney, Agent, or Firm* — Foley & Lardner LLP

(57) ABSTRACT

A semiconductor device includes an N-type insulated-gate field-effect transistor including a first insulating layer that is provided along side walls of a gate electrode, has a negative thermal expansion coefficient, and applies a tensile stress to a channel region of the N-type insulated-gate field-effect transistor. The device also includes a P-type insulated-gate field-effect transistor including a second insulating layer that is provided along side walls of a gate electrode, has a positive thermal expansion coefficient, and applies a compression stress to a channel region of the P-type insulated-gate field-effect transistor.

20 Claims, 9 Drawing Sheets

OTHER PUBLICATIONS

A.W. Sleight "Compounds That Contract on Heating", Inorg. Chem., 1998, vol. 37, No. 12, pp. 2854-2860.

H.S. Yang et al. "Dual Stress Liner for High Performance sub-45nm Gatelength SOI CMOS Manufacturing", IEDM, 2004, p. 1075.

* cited by examiner

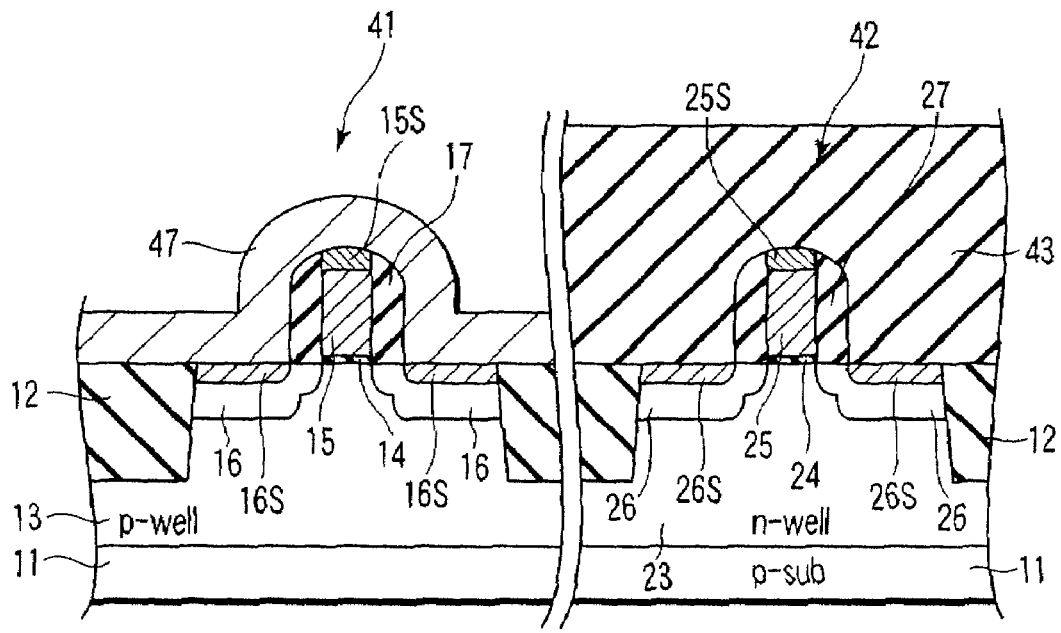
F I G. 5
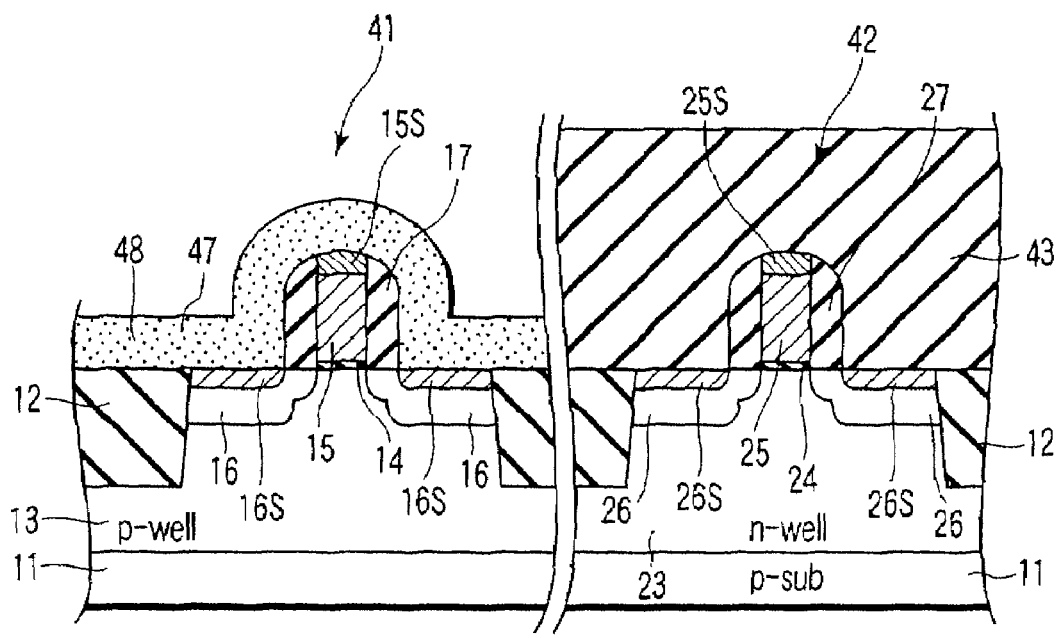
F I G. 6

← Channel lenght direction →

SEMICONDUCTOR DEVICE THAT IS ADVANTAGEOUS IN OPERATIONAL ENVIRONMENT AT HIGH TEMPERATURES

CROSS-REFERENCE TO RELATED APPLICATIONS

This application is a divisional of U.S. application Ser. No. 11/481,251, filed Jul. 6, 2006, which has issued as U.S. Pat. No. 7,420,840, and which is based upon and claims the benefit of priority from prior Japanese Patent Application No. 2005-249752, filed Aug. 30, 2005, the entire contents of all of which are incorporated herein by reference.

BACKGROUND OF THE INVENTION

1. Field of the Invention

The present invention relates generally to a semiconductor device, and the invention is applicable to, e.g. a transistor in which the mobility of electrons or holes is varied by applying a stress to a semiconductor substrate.

2. Description of the Related Art

In the prior art, as one of active devices that constitute an LSI (large-scale integration), there is known an insulated-gate field-effect transistor (hereinafter referred to as "transistor") that is represented by a MOS (metal oxide semiconductor) transistor or a MIS (metal insulator semiconductor) transistor. With development in fine patterning of the transistors, the number of transistors in the LSI has become enormous. Being in direct proportion to the integration level, the heat emitted from the transistors becomes more and more intensive as the number of the transistors increases. As a result, the degree of lattice vibration of the crystal lattice of, e.g. silicon that forms the transistor becomes higher and the corresponding thermal disturbance becomes more and more severe, decreasing the mobility of electrons or holes (carriers).

To solve this problem, a semiconductor device has been proposed, wherein an insulating material that imparts a stress is buried in suitable places around the transistors and, as a result, a desired stress is applied to the channel region of the transistor, thus improving the mobility of electrons or holes (see Jpn. Pat. Appln. KOKAI Publication No. 2004-63591, for instance).

In this structure, however, the stress that can be imparted by the insulating material is invariable in relation to a temperature rise of the semiconductor substrate, etc. Thus, when the temperature of the LSI rises from room temperature to high temperatures (e.g. about 200° C.), the effect of the stress becomes insufficient due to the intensified thermal disturbance of silicon, etc. As a result, the mobility of electrons or holes decreases.

Consequently, there is such a tendency that the mobility of electrons or holes (carriers) becomes lower as the temperature of the LSI rises.

BRIEF SUMMARY OF THE INVENTION

According to an aspect of the present invention, there is provided a semiconductor device comprising: an N-type insulated-gate field-effect transistor including a first insulating layer that is provided along side walls of a gate electrode, has a negative expansion coefficient, and applies a tensile stress to a channel region of the N-type insulated-gate field-effect transistor; and a P-type insulated-gate field-effect transistor including a second insulating layer that is provided along side walls of a gate electrode, has a positive thermal expansion coefficient, and applies a compression stress to a channel region of the P-type insulated-gate field-effect transistor.

According to another aspect of the present invention, there is provided a semiconductor device comprising: an N-type insulated-gate field-effect transistor including a first insulating layer that is provided along side walls of a gate electrode, has a negative thermal expansion coefficient, and applies a tensile stress to a channel region of the N-type insulated-gate field-effect transistor; and a P-type insulated-gate field-effect transistor including a second insulating layer that is provided along side walls of a gate electrode, has a positive thermal expansion coefficient, and applies a compression stress to a channel region of the P-type insulated-gate field-effect transistor.

According to still another aspect of the present invention, there is provided a semiconductor device comprising: an insulated-gate field-effect transistor including a gate electrode that is provided on a semiconductor substrate, a source and a drain that are provided in the semiconductor substrate such that the gate electrode is interposed between the source and the drain, a first insulating layer that is provided to extend from over the source and the drain to over the gate electrode and applies a first tensile stress to a channel region of the insulated-gate field-effect transistor, and a second insulating layer having also a negative thermal expansion coefficient that is provided on the first insulating layer in a direction crossing the first insulating layer and applies a second tensile stress to the channel region at the same time as the first tensile stress in a direction crossing a direction of the first tensile stress.

BRIEF DESCRIPTION OF THE SEVERAL VIEWS OF THE DRAWING

FIG. 5 is a cross-sectional view that illustrates the fabrication method of the semiconductor device according to the first embodiment of the invention;

FIG. 6 is a cross-sectional view that illustrates the fabrication method of the semiconductor device according to the first embodiment of the invention;

DETAILED DESCRIPTION OF THE INVENTION

Figure 1:
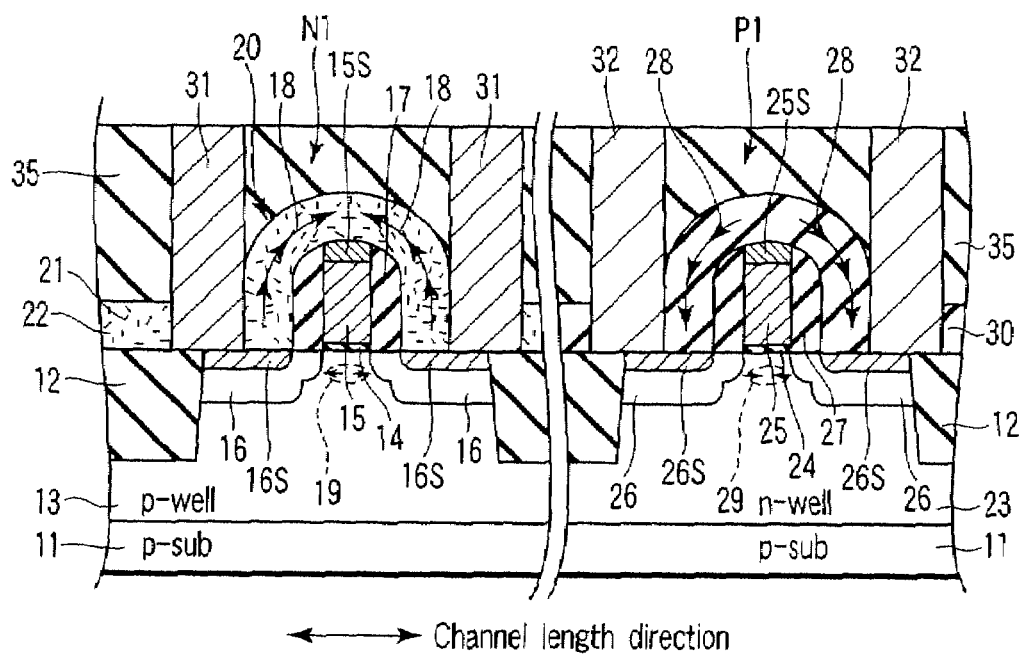
FIG. 1 is a cross-sectional view that shows a semiconductor device according to a first embodiment of the present invention.

Embodiments of the present invention will now be described with reference to the accompanying drawings. In the description below, common parts are denoted by like reference numerals throughout the drawings.

First Embodiment

A semiconductor device according to a first embodiment of the present invention is described with reference to FIG. 1. FIG. 1 is a cross-sectional view that schematically shows the semiconductor device according to the first embodiment.

As is shown in FIG. 1, an NMOS transistor N1 that is an N-type MOS transistor is provided on a P-well (p-well) 13 in a P-type semiconductor (e.g. silicon) substrate (p-sub) 11, which is isolated by a device isolation film 12. A PMOS transistor P1 that is a P-type MOS transistor is provided on an N-well (n-well) 23 in the same substrate 11. An interlayer insulation film 35 is provided so as to cover the transistors N1 and P1.

The NMOS transistor N1 comprises a gate insulation film 14, a gate electrode 15, source/drain regions 16, silicide layers 15S and 16S, spacers 17, an insulating layer 20, and source/drain contact plugs 31.

The gate insulation film 14 is provided on the P-well 13 in the semiconductor substrate 11. The gate electrode 15 is provided on the gate insulation film 14. The source/drain regions 16 are provided spaced apart in the P-well 13 so as to sandwich the gate electrode 15. The silicide layer 15S is provided on the gate electrode 15, and the silicide layers 16S are provided on the source/drain regions 16. The insulating layer 20 is continuously provided over the silicide layers 16S, spacers 17 and silicide layer 15S. The source/drain contact plugs 31 penetrate the interlayer insulation film 35 and insulating layer 20 and are provided on the surfaces of the source/drain regions 16.

The insulating layer 20, in this embodiment, is an insulating layer that is formed of so-called pyroceramics including an amorphous matrix layer 22 and crystallines 21 that are dispersed in the amorphous matrix layer 22. The crystallines 21 are formed of, e.g. $LiAlSiO_4$. The insulating layer 20, as a whole, has a negative thermal expansion coefficient (negative expansion factor) $[\Delta V/V/\Delta T]$ (V: volume, T: temperature, $\Delta V$: variation in volume). The negative thermal expansion coefficient, in this context, means a ratio by which the volume decreases in accordance with a rise in temperature. The thermal expansion coefficient of the insulating layer 20 according to this embodiment is, e.g. about $-8 \times 10^{-6}$/K. The crystallines 21 have a negative thermal expansion coefficient, and the amorphous matrix layer 22 has a positive thermal expansion coefficient. Thus, it is desirable that the ratio of the crystallines 21 in the entire insulating layer 20 be greater than the ratio of the amorphous matrix layer 22 in the entire insulating layer 20.

The PMOS transistor P1 comprises a gate insulation film 24, a gate electrode 25, source/drain regions 26, silicide layers 25S and 26S, spacers 27, an insulating layer 30, and source/drain contact plugs 32.

The gate insulation film 24 is provided on the N-well 23. The gate electrode 25 is provided on the gate insulation film 24. The source/drain regions 26 are provided spaced apart in the N-well 23 so as to sandwich the gate electrode 25. The silicide layer 25S is provided on the gate electrode 25, and the silicide layers 26S are provided on the source/drain regions 26. The insulating layer 30 is continuously provided over the silicide layers 26S, spacers 27 and silicide layer 25S. The source/drain contact plugs 32 penetrate the interlayer insulation film 35 and insulating layer 30 and are provided on the surfaces of the source/drain regions 26.

The insulating layer 30 is a liner insulating layer that is formed of, e.g. $Si_3N_4$. The insulating layer 30 has a positive thermal expansion coefficient (positive expansion factor) $[\Delta V/V/\Delta T]$ (V: volume, T: temperature, $\Delta V$: variation in volume). The positive thermal expansion coefficient, in this context, means a ratio by which the volume increases in accordance with a rise in temperature.

<Operation>

Next, the operation of the semiconductor device according to this embodiment is described.

In the case of the NMOS transistor N1, a desired voltage is applied to the gate electrode 15 and the source/drain regions 16, thereby to operate the transistor N1. Consequently, the transistor N1 produces heat due to an electric current flowing in the channel of the transistor N1.

If the heat is conducted to the insulating layer 20, the insulating layer 20 contracts according to its own negative thermal expansion coefficient. Accordingly, a stress 18 occurs in the insulating layer 20 in a direction from the source/drain regions 16 toward the silicide layer 15S. As a result, a tensile stress is caused in the channel region 19 in its channel direction. The stress 18 is, e.g. about 80 to 100 [GPa].

In the case of the PMOS transistor P1, a desired voltage is applied to the gate electrode 25 and the source/drain regions 26, thereby to operate the transistor P1. Consequently, the transistor P1 produces heat due to an electric current flowing in the channel of the transistor P1.

If the heat is conducted to the insulating layer 30, the insulating layer 30 expands according to its own positive thermal expansion coefficient. Accordingly, a stress 28 occurs in the insulating layer 30 in a direction from the silicide layer 25S toward the source/drain regions 26. As a result, a compression stress is caused in the channel region 29 in its channel direction. The stress 28 is, e.g. about several to several-ten [GPa].

Needless to say, the same operation is obtained when the LSI including the transistors N1 and P1 operates and produces heat, as well as when the transistors N1 and P1 operate and produce heat.

According to the semiconductor device of the above-described embodiment, the following advantageous effects (1) and (2) can be obtained.

(1) As the temperature of the LSI rises from room temperature to higher temperatures (e.g. about 200° C.), the mobility of electrons or holes (carriers) can be enhanced.

As has been described above, in the case of the is NMOS transistor N1, the heat, which is produced by the transistor N1 when the transistor N1 operates, is conducted to the insulating layer 20. Due to the heat, the insulating layer 20 contracts according to its own negative thermal expansion coefficient. Accordingly, the stress 18 occurs in the insulating layer 20 in a direction from the source/drain regions 16 toward the silicide layer 15S. As a result, the tensile stress is caused in the channel region 19 in its channel length direction.

It is known that in the case of the NMOS transistor, the mobility of electrons is enhanced if a tensile stress is applied to the channel region in the channel direction. Thus, even in the case where the temperature of the substrate 11, etc. rises to high temperatures, the mobility of electrons in the transistor N1 can be enhanced.

In the case of the PMOS transistor P1, the heat, which is produced by the transistor P1 when the transistor P1 operates, is conducted to the insulating layer 30. Due to the heat, the insulating layer 30 expands according to its own positive thermal expansion coefficient. Accordingly, the stress 28 occurs in the insulating layer 30 in a direction from the silicide layer 25S toward the source/drain regions 26. As a result, the compression stress is caused in the channel region 29 in its channel length direction.

Thus, even in the case where the temperature of the substrate 11, etc. rises to high temperatures, the mobility of holes in the transistor P1 can be enhanced.

Moreover, as the temperature becomes higher, the stress 18, 28 increases. Therefore, the enhancement in mobility of electrons or holes becomes conspicuous as the temperature becomes higher.

The volume of the insulating layer 20 decreases in proportion to the rise in temperature. Thus, a tensile stress that is proportional to the rise in temperature can be applied to the channel region 19. Similarly, the volume of the insulating layer 30 increases in proportion to the rise in temperature. Thus, a compression stress that is proportional to the rise in temperature can be applied to the channel region 29.

Even in the case where the LSI including the transistors N1 and P1 rises to high temperatures and a thermal disturbance of silicon, etc. is intensified, it is possible to prevent the mobility of electrons or holes from decreasing. Therefore, under the present circumstance in which LSIs, etc. operate at high temperatures due to recent development in microfabrication of transistors, this invention is very advantageous in that degradation in characteristics of transistors can be prevented.

(2) The mobility of electrons in the transistor N1 and the mobility of holes in the transistor P1 can be enhanced at the same time.

As has been described above, the transistors N1 and P1 are provided on the same substrate 11, and the desired tensile stress and compression stress can be applied at the same time to the channel regions 19 and 29 of the transistors N1 and P1, respectively, in accordance with the rise in temperature.

Thus, the semiconductor device of this embodiment is advantageous in that the mobility of electrons or holes can be enhanced at the same time in the NMOS transistor N1 and PMOS transistor P1. For example, even in the case where the transistors N1 and P1 are applied to a so-called CMOS circuit, the CMOS circuit with the enhanced mobility can advantageously be obtained.

One end of the insulating layer 20 and one end of the insulating layer 30 may continuously be connected. In this case, since one of the insulating layers 20 and 30 contracts/expands, the other of the insulating layers 30 and 20 can more easily expand/contract. Thus, the stresses 18 and 28 can be increased at the same time, and the tensile stress and compression stress occurring in the channel regions 19 and 29, respectively, can be increased at the same time. Therefore, the mobility of electrons and the mobility of holes can advantageously be enhanced at the same time.

<Fabrication Method>

A fabrication method of the semiconductor device according to the first embodiment will now be described with reference to FIG. 2 to FIG. 10, taking the semiconductor device shown in FIG. 1 by way of example.

Figure 2:
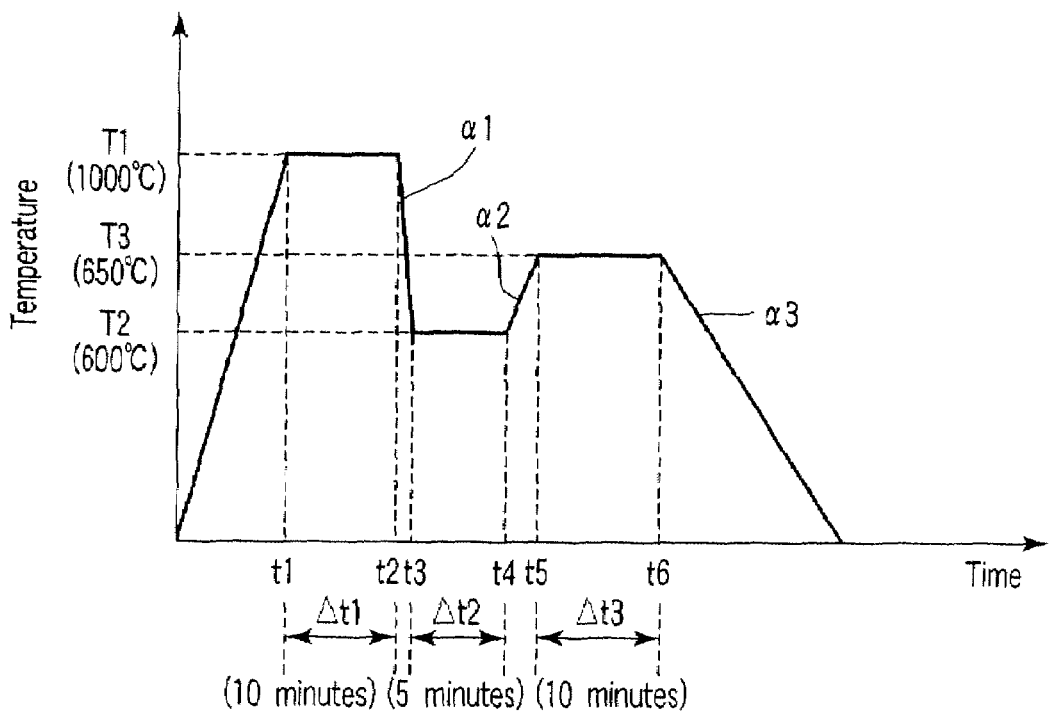
FIG. 2 is a timing chart for explaining a fabrication method of the semiconductor device according to the first embodiment of the invention.
Figure 7:
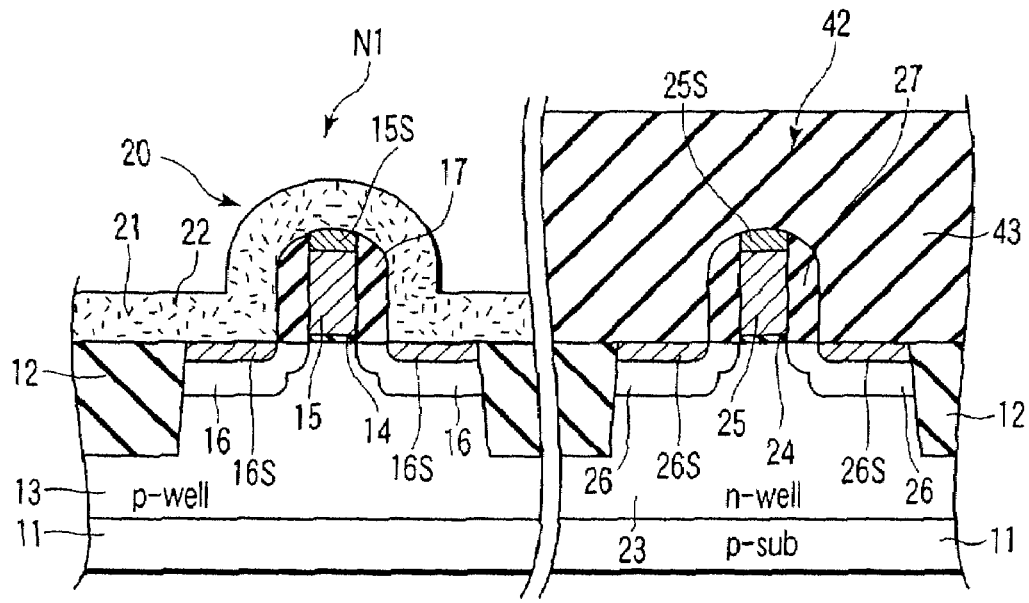
FIG. 7 is a cross-sectional view that illustrates the fabrication method of the semiconductor device according to the first embodiment of the invention.
Figure 8:
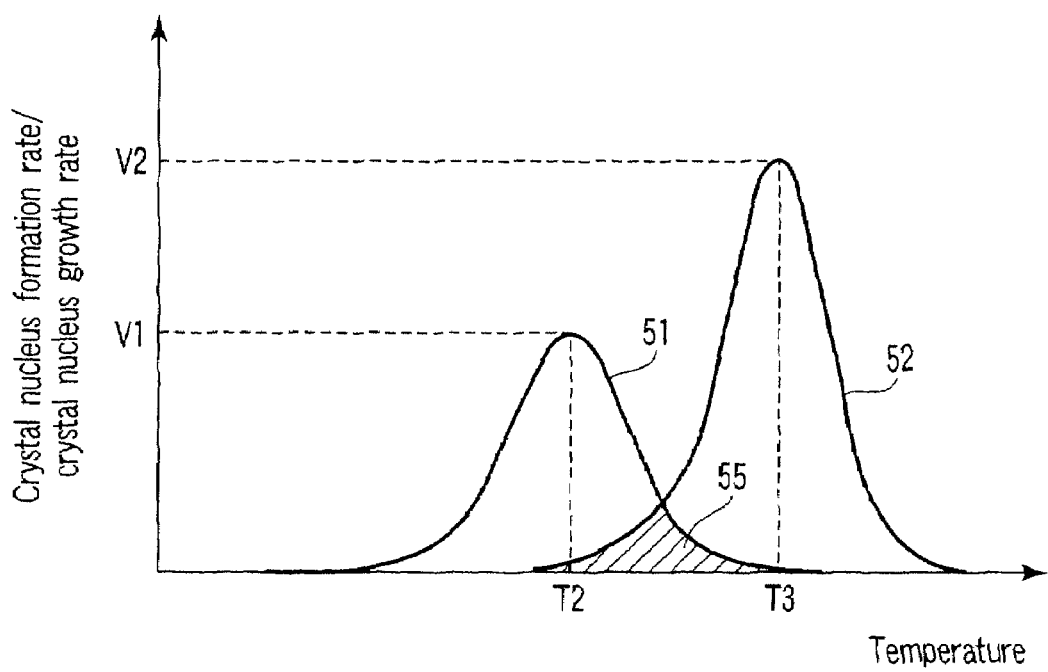
FIG. 8 is a graph for explaining the fabrication method of the semiconductor device according to the first embodiment of the invention, FIG. 8 showing the relationship between temperatures and a crystal nucleus formation speed and the relationship between temperatures and a crystal nucleus growth speed.

FIG. 2 is a timing chart for explaining the fabrication method of the semiconductor device according to the first embodiment of the invention. FIGS. 3 to 7, FIG. 9 and FIG. 10 are cross-sectional views that illustrate fabrication process steps of the semiconductor device according to the first embodiment. FIG. 8 is a graph showing the relationship between temperatures and a crystal nucleus formation speed and the relationship between temperatures and a crystal nucleus growth speed in the semiconductor device of this embodiment. The description below of the fabrication method is based on the timing chart of FIG. 2.

To start with, by conventional process steps, a device isolation film 12 is formed in the semiconductor substrate 11, and impurities such as boron (B) or phosphorus (P) are implanted in NMOS and PMOS formation regions, thus forming a P-well 13 and an N-well 23 (these steps are not illustrated). Further, using conventional process steps, gate insulation films 14 and 24, gate electrodes 15 and 25, source/drain regions 16 and 26, spacers 17 and 27, and silicide layers 15S, 16S, 25S and 26S are formed (these steps are not illustrated).

Figure 3:
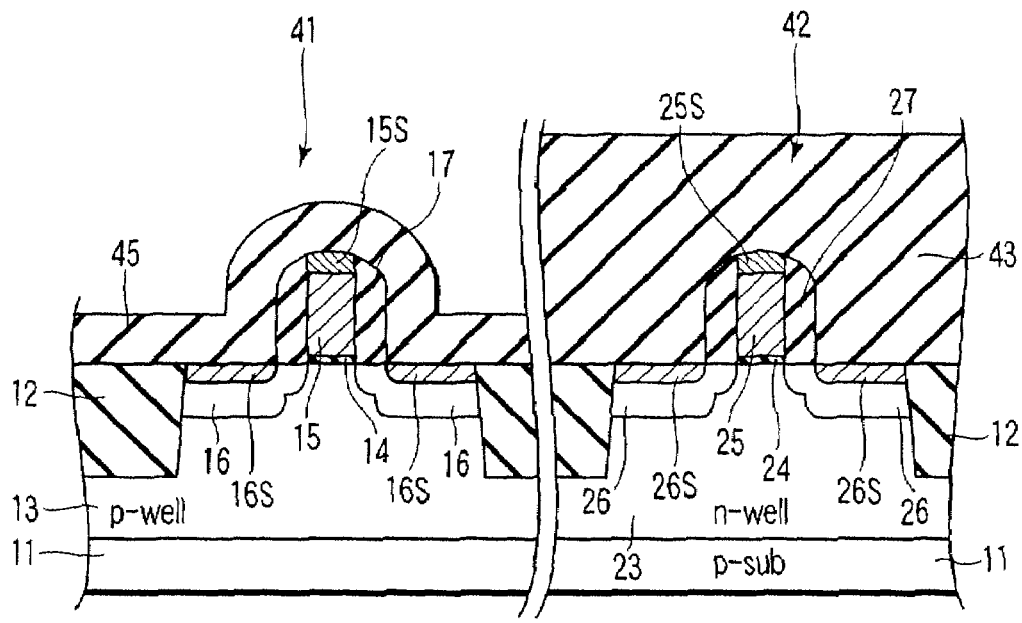
FIG. 3 is a cross-sectional view that illustrates the fabrication method of the semiconductor device according to the first embodiment of the invention.

Subsequently, as shown in FIG. 3, a silicon nitride ($Si_3N_4$) film, for instance, is deposited on a PMOS formation region 42 by means of, e.g. CVD (chemical vapor deposition), thereby forming a protection film 43. Then, a silicon oxide ($SiO_2$) film 45 is formed on an NMOS formation region 41 and protection film 43 by means of, e.g. CVD.

Figure 4:
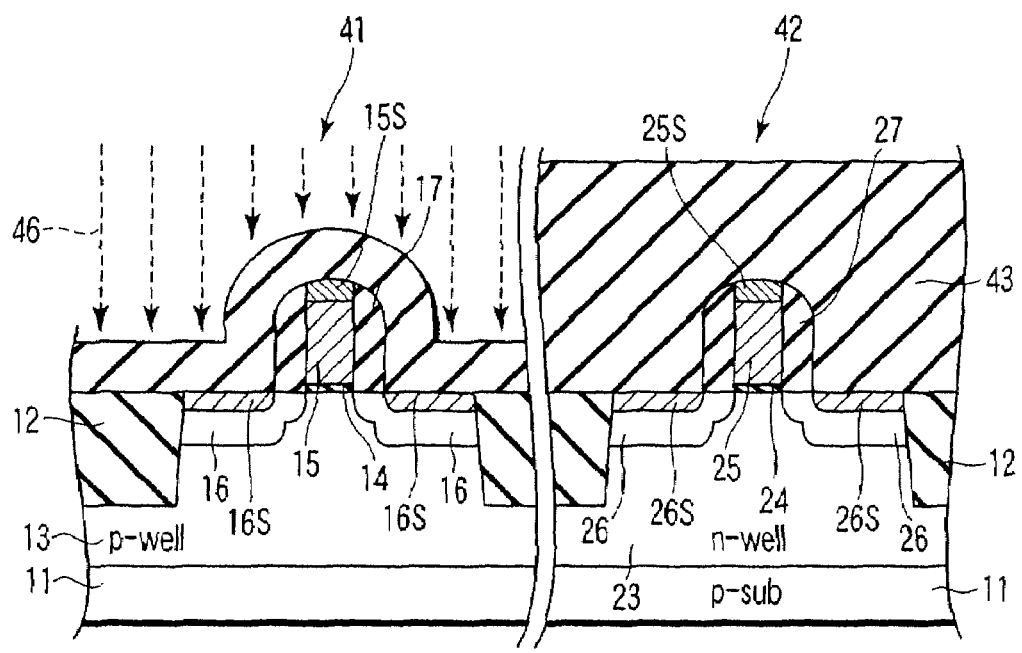
FIG. 4 is a cross-sectional view that illustrates the fabrication method of the semiconductor device according to the first embodiment of the invention.

In a subsequent step shown in FIG. 4, using the protection film 43 as a mask, ions (crystal seeds) 46 such as lithium (Li), aluminum (Al) or titanium (Ti) are implanted by, e.g. ion implantation in the NMOS formation region 41.

Thereafter, as shown in FIG. 2 and FIG. 5, during a time period between t1 and t2, the resultant structure is subjected to heat treatment, for example, in an oxygen atmosphere, for a time period Δt1 (e.g. about 10 minutes) at a temperature T1 (e.g. about 1000° C.). Thus, an amorphous layer 47, which is in an amorphous state, is formed.

At the time instant t2, the temperature of the structure is lowered to T2 (e.g. about 600° C.) at a temperature-decrease rate α1. Preferably, the rate α1 should be as high as possible.

At a time period between t3 and t4, the amorphous layer 47 is annealed, for example, for a time period Δt2 (e.g. about 5 minutes) at temperature T2 (e.g. about 600° C.). Thus, crystal nuclei 48 are precipitated at high density in the amorphous layer 47 as shown in FIG. 6. The size of each crystal nucleus 48 is, e.g. about several nm (nanometer).

It is preferable that the temperature for the heat treatment in the above step (between t3 and t4) be set at T2 (600° C. in this embodiment) at which the crystal nuclei 48 are precipitated at the maximum rate. In other words, as shown by a solid line 51 in FIG. 8, since the rate at which crystal nuclei 48 are precipitated takes a maximum value V1 at temperature T2, the crystal nuclei 48 can be formed at high density in a short time period.

At time instant t4, the temperature of the amorphous layer 47 including the crystal nuclei 48 is raised to T3 (e.g. about 650° C.) at a temperature-increase rate α2. Preferably, the temperature-increase rate α2 be as high as possible in order to prevent non-uniform growth of the crystal nuclei 48.

During a time period between t5 and t6, the amorphous layer 47 including the crystal nuclei 48 is annealed, for example, for a time period Δt3 (e.g. about 10 minutes) at temperature T3 (e.g. about 650° C.). Thereby, the crystal nuclei 48 are grown into crystallines 21 as shown in FIG. 7. At the same time, by growing the crystal nuclei 48 into the crystallines 21, the ion species 46 that are implanted into the amorphous layer 47 by the ion implantation step are sufficiently precipitated, and an amorphous matrix layer 22 is formed. Thus, pyroceramics comprising the amorphous matrix layer 22 and crystallines 21 is formed, and the insulating layer 20 is formed. The size of each crystalline 21 is, e.g. about several nm to several-ten nm.

It is preferable that the temperature for the anneal in the above step (between t5 and t6) be set at T3 at which the crystal nuclei 48 are grown at the maximum rate. In other words, as shown by a solid line 52 in FIG. 8, since the rate at which crystal nuclei 48 are grown takes a maximum value V2 at temperature T3, the crystal nuclei 48 are grown in a short time period.

It is not preferable to perform annealing in a region 55 that is defined by solid lines 51 and 52 in FIG. 8. In the region 55, the density of crystal nuclei 48 lowers and sufficient growth cannot be performed.

At a time instant t6, the insulting layer 20 is cooled down to room temperature at a temperature-decrease rate α3. It is desirable that the rate αe be as low as possible in order to relax the internal stress that is caused by the crystal growth.

Through the above steps, the insulating layer 20 that is formed of pyroceramics is fabricated. The composition of the pyroceramics in this embodiment is merely an example. It should suffice if an amorphous state is created by a composition such as a combination of $Li_2O$—$Al_2O_3$—$SiO_2$—$TiO_2$.

Figure 9:
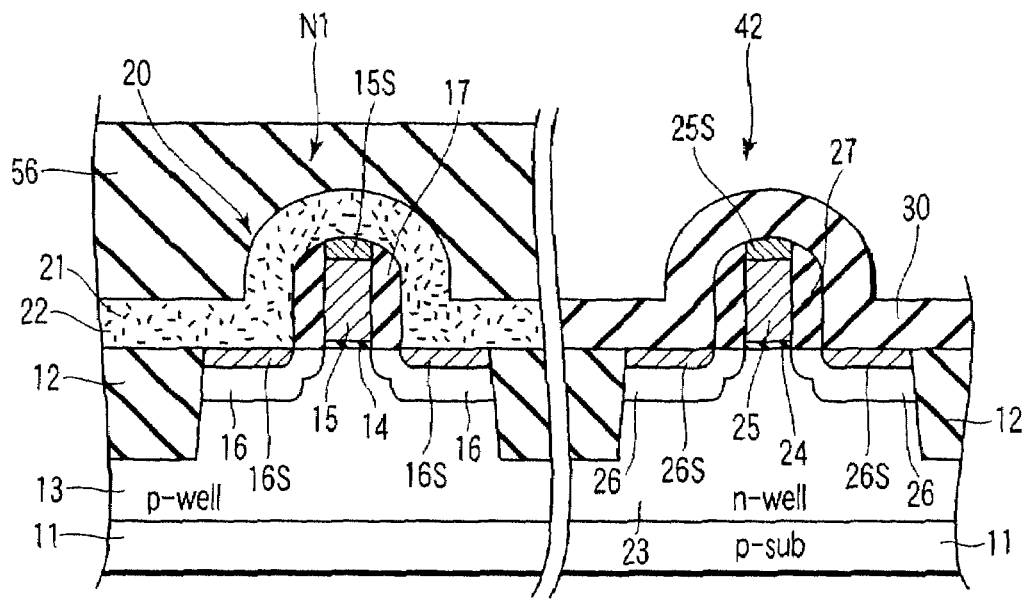
FIG. 9 is a cross-sectional view that illustrates the fabrication method of the semiconductor device according to the first embodiment of the invention.

Subsequently, as shown in FIG. 9, a silicon nitride film, for instance, is deposited on the insulating layer 20 of the NMOS region 41 by means of, e.g. CVD, thus forming a protection film 56. Then, the protection film 43 on the PMOS region 42 is removed. Thereafter, a layer of $Si_4N_4$, for instance, which has a positive expansion coefficient, is deposited on the PMOS formation region 42 and the protection film 56, thus forming an insulating layer 30.

Figure 10:
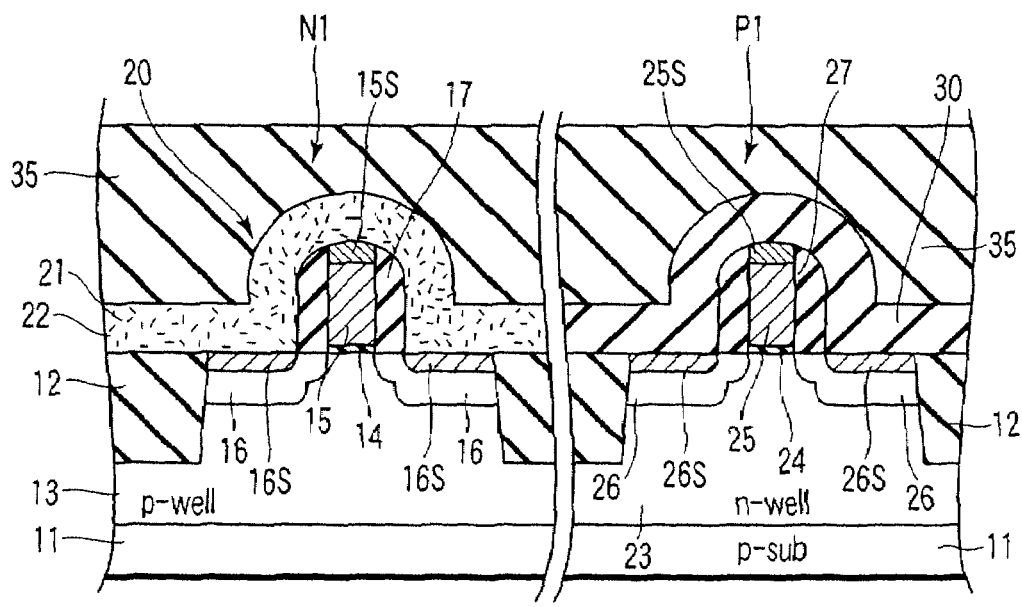
FIG. 10 is a cross-sectional view that illustrates the fabrication method of the semiconductor device according to the first embodiment of the invention.

Then, as shown in FIG. 10, the protection film 56 in the NMOS formation region 41 is removed. Thereafter, a silicon oxide film ($SiO_2$) is deposited on the insulating layer 20 and insulating layer 30 by means of, e.g. CVD, thus forming an interlayer insulation film 35.

Thereafter, those portions of the interlayer insulation film 35 and insulating layers 20 and 30, which lie on the source/drain regions 16 and 26, are removed by means of, e.g. RIE (Reactive Ion Etching), and trenches are formed (not illustrated). At last, Cu, for instance, is buried in the trenches, and source/drain contact plugs 31 and 32 are formed (not illustrated).

Through the above fabrication steps, the semiconductor device shown in FIG. 1 is manufactured.

As has been described above, in the fabrication method of the semiconductor device according to the present embodiment, the amorphous layer 47 in which the crystal seed 46 is implanted is annealed, and thereby the crystal nuclei 48 are formed in the amorphous layer 47 (FIG. 6). Subsequently, the amorphous layer 47 is further annealed, and the crystal nuclei 48 are grown into the crystallines 21, and the amorphous matrix layer 22 is formed. Thus, the insulating layer 20 of the pyroceramics is formed (FIG. 7).

By designing and performing the two-stage annealing (heat treatment) steps in the temperature region (period between t3 and t4) for forming the crystal nuclei 48 and in the temperature region (period between t5 and t6) for growing the crystallines 21, the insulating layer 20 that has a negative expansion coefficient as a whole is formed.

According to this fabrication method, the following advantageous effects (1) to (4) can be obtained.

(1) The optimal mobility of electrons/holes (carriers) in the transistor N1, P1 can be chosen.

The degrees of tensile stress and compression stress, which are applied to the channel regions 19 and 29, increase in accordance with the thickness and length of the insulting layers 20 and 30, respectively.

When the silicon oxide film 45 (FIG. 3) and $Si_3N_4$ film 30 (FIG. 9) are to be formed, the conditions for a reaction time, etc. are controlled and optimal film thickness and length are chosen. Thereby, the optimal mobility of electrons in the transistor N1 and the optimal mobility of holes in the transistor P1 can advantageously be chosen.

In addition, where necessary, the thickness of the insulating layer 20, for example, may be set to be about twice as great as the thickness of the insulating layer 30. Thereby, the tensile stress and compression stress, which are applied to the channel region 19 of the transistor N1 and the channel region 29 of the transistor P1, can be varied, and the balance of mobility can be adjusted on an as-needed basis.

(2) By properly selecting the heat treatment step, the expansion coefficient of the insulating layer 20 can be controlled in a wide range. Thus, the optimal thermal expansion coefficient of the insulating layer 20 for the actual device operations can be selected.

As is shown in FIG. 8, the insulating layer 20 has two temperature regions, i.e. the temperature region indicated by solid line 51 in which the crystal nuclei 48 are formed, and the temperature region indicated by solid line 52 in which the crystal nuclei 48 are grown. Thus, the insulating layer 20 with a relatively low thermal expansion coefficient can be formed if heat treatment is executed at low temperatures in the temperature region indicated by solid line 51 and if heat treatment is executed at temperature T3, at which the growth rate of crystal nuclei takes a maximum value, in the temperature region indicated by solid line 52.

In this manner, when the heat treatment step (FIG. 6, FIG. 7) is performed, the temperatures (e.g. T2 and T3) in the temperature ranges indicated by solid lines 51 and 52 and the time periods (e.g. Δt2, Δt3) can variously be combined. Thereby, the crystallines 21 and amorphous matrix layer 22 having various densities and dimensions can be formed. Therefore, the margin of the thermal expansion coefficient can be increased, and the insulating layer 20 that may easily have a target thermal expansion coefficient can advantageously be formed.

When the ion implantation step (FIG. 4) is performed, the kind, composition, implantation amount, etc. of the crystal seeds 46 may be chosen, whereby a necessary thermal expansion coefficient can be controlled.

As has been described above, even if the composition, etc. is the same, optimal conditions can be selected in the ion implantation step (FIG. 4) and the heat treatment step (FIG. 6, FIG. 7). Therefore, thermal expansion coefficients can be controlled in a wide range in accordance with the purpose.

(3) To be more specific, for example, by selecting the temperature T2, temperature T3, and time period Δt2>time period Δt3, it is possible to form the insulating layer 20, which has a large negative thermal expansion coefficient and to which a large tensile stress can be applied.

A condition that is necessary for the insulating layer to apply a greater tensile stress to the channel region 19 is that the insulating layer has a greater negative thermal expansion coefficient. In order to meet this condition, it is preferable that the crystallines 21 be formed with high density. If the time period Δt2 is set at a great value, the density of crystal nuclei 48 can be increased. In addition, if the time period Δt3 is set at a great value, each crystal nucleus 48 can be grown into a large crystalline 21.

Thus, when the temperatures T2 and T3 are selected as in the present embodiment, both temperatures can realize the maximum rates of formation and growth of crystal nuclei (FIG. 8). By setting the time period Δt2 to be longer than time period Δt3 (time period Δt2>time period Δt3), it becomes possible to form the pyroceramics insulating layer 20 in which crystallines 21 are formed with high density. If the time period Δt2 is too short, the density of crystal nuclei 48 lowers and the crystallines 21 cannot be formed with high density. On the other hand, if the time period Δt3 is too long, each crystal nucleus 48 grows too large and a crack due to stress may occur.

Hence, the ratio of the crystallines 21 in the entire insulating layer 20 can be set to be greater than the ratio of the amorphous matrix layer 22 in the entire insulating layer 20. As a result, the thermal expansion coefficient of the entirety of the insulating layer 20 can be set at a negative value, and the negative thermal expansion coefficient can advantageously be made greater.

(4) The crystal nuclei 48 can be uniformly grown, and the stress that is applied by the insulating layer 20 can be made uniform.

By setting the rate α2 as high as possible, the temperature of the amorphous layer 47 can quickly be raised to the temperature T3 at which the crystal nuclei 48 are grown at the maximum rate. Thereby, non-uniformity in temperature can be prevented, and the times of growth of respective crystal nuclei 48 can be made uniform. Therefore, the crystal nuclei 48 can uniformly be grown and the grain size of the crystallines 21 can be made uniform, and the stress that is applied by the insulating layer 20 can advantageously be made uniform.

Second Embodiment

A semiconductor device according to a second embodiment of the invention is described with reference to FIG. 11. A description of the parts that are common to those in the first embodiment is omitted.

Figure 11:
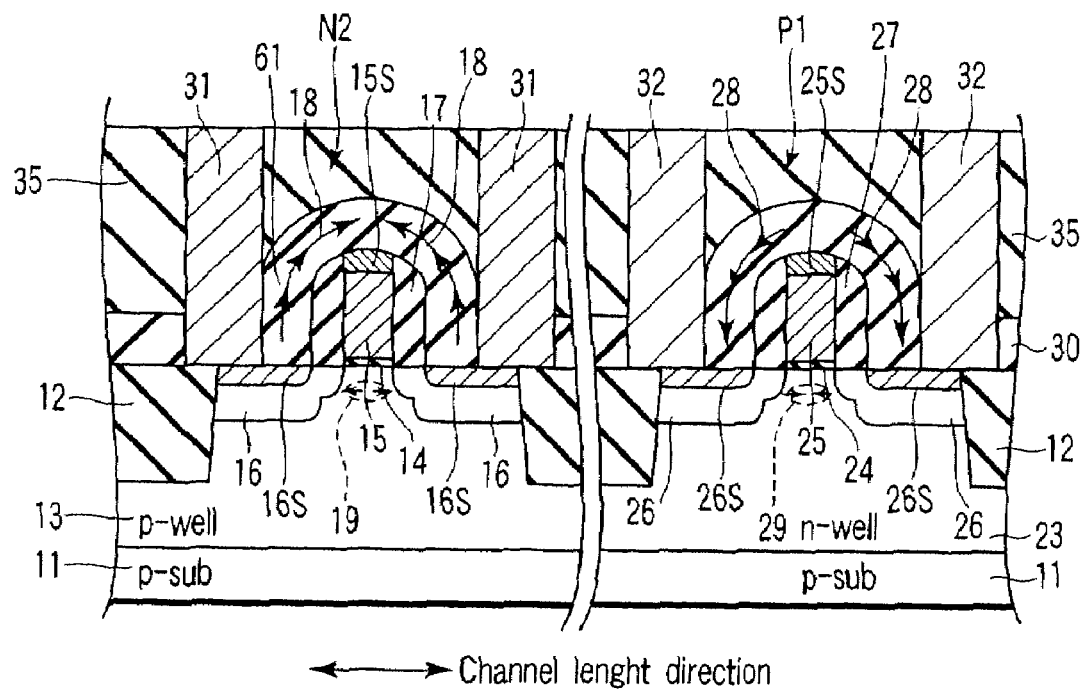
FIG. 11 is a cross-sectional view that shows a semiconductor device according to a second embodiment of the present invention.

As is shown in FIG. 11, an NMOS transistor N2 is provided on the P-well 13 in the semiconductor substrate 11, and a PMOS transistor P1 is provided on the N-well 23.

The semiconductor device of the second embodiment differs from that of the first embodiment in that a $HfW_2O_8$ layer 61 is provided, as an insulating layer with a negative thermal expansion coefficient, over the silicide layers 16S, spacers 17 and silicide layer 15S. The $HfW_2O_8$ layer 61 has an thermal expansion coefficient of about $-10 \times 10^{-6}$/K in a range between room temperature and about 800K.

Accordingly, when the temperature of the transistor N2 rises in operation, the $HfW_2O_8$ layer 61 contracts and a stress 18 occurs in a direction from the source/drain regions 16 towards the silicide layer 15S. As a result, a tensile stress can be caused in the channel region 19 in its channel length direction, and the mobility of electrons can be enhanced.

The structure and operation of the semiconductor device in the other respects are the same as those in the first embodiment.

As has been described above, according to the semiconductor device of this embodiment, the same advantageous effects as with the first embodiment can be obtained. Further, the $HfW_2O_8$ layer 61 is provided, as an insulating layer with a negative thermal expansion coefficient, over the silicide layers 16S, spacers 17 and silicide layer 15S.

The thermal expansion coefficient of the $HfW_2O_8$ layer 61 varies in a wide range between room temperature and about 800K. Thus, the $HfW_2O_8$ layer 61 is widely applicable to temperature environments in which the device operates.

As described above, the $HfW_2O_8$ layer 61 can be applied where necessary.

Next, a fabrication method of the semiconductor device according to this embodiment is described with reference to FIG. 12 and FIG. 13, taking the semiconductor device shown in FIG. 11 by way of example.

An aqueous solution of $HfOCl_2 \cdot 6H_2O$ is mixed in an ammonium solution of $H_2WO_4$, and a chemical reaction is caused. A reaction product of $HfW_2O_8$ is obtained (not illustrated). The obtained $HfW_2O_8$ is dried and heated up to about 1200° C. at 600° C./h. The $HfW_2O_8$ is kept at the temperature for about two hours, and $HfW_2O_8$ powder is formed (not illustrated).

Figure 12:
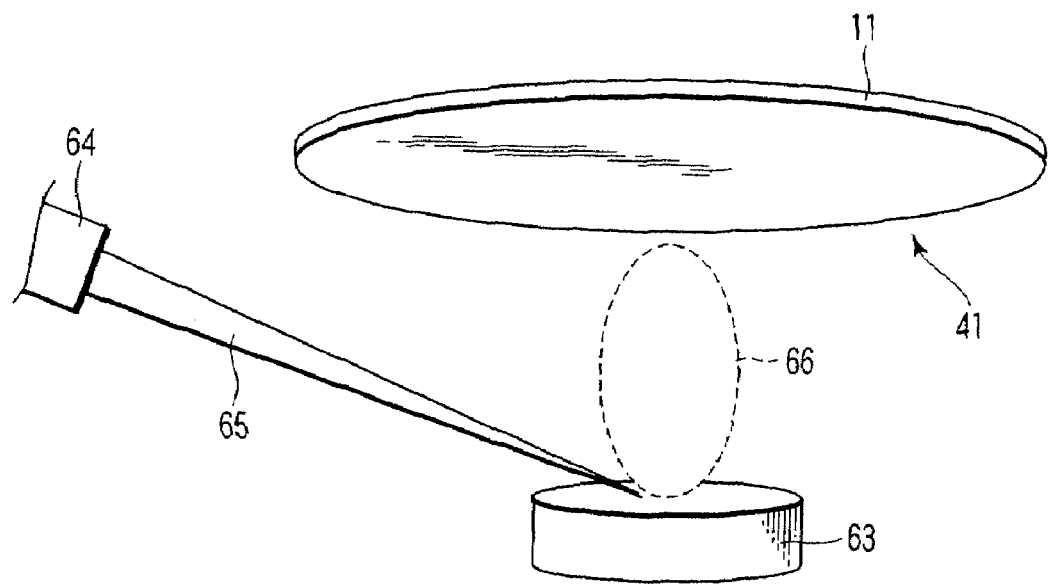
FIG. 12 is a view for explaining a laser ablation method, which is executed in a fabrication method of the semiconductor device according to the second embodiment of the invention.

Then, as shown in FIG. 12, the $HfW_2O_8$ powder is sintered, and a ceramics target 63 in a pellet form is fabricated.

Subsequently, a laser ablation process is executed to apply a laser beam 65 from a light source 64 to the target 63, thereby heating the target 63. A plume 66 of $HfW_2O_8$ powder emanates from the heated target 63.

Figure 13:
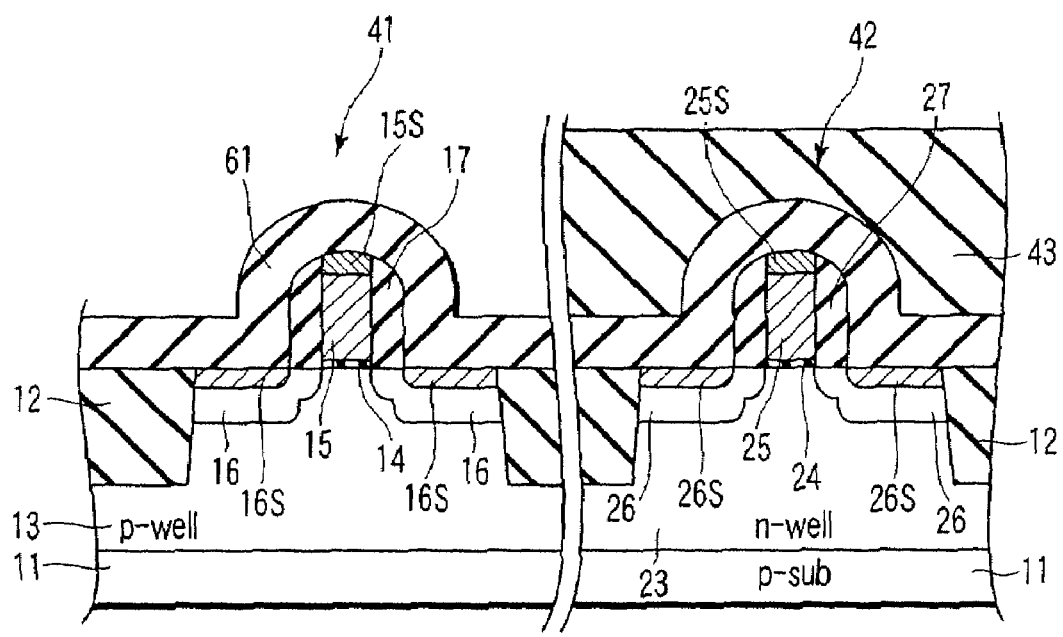
FIG. 13 is a cross-sectional view that illustrates the fabrication method of the semiconductor device according to the second embodiment of the invention.

Following the above, as shown in FIG. 13, the plume 66 of $HfW_2O_8$ powder is evaporated and deposited on the NMOS formation region 41 of the semiconductor substrate 11. Thus, a $HfW_2O_8$ layer 61 is formed.

Thereafter, through the same fabrication steps as in the first embodiment, the insulating layer 30 and interlayer insulation film 35 are formed, and the semiconductor device shown in FIG. 11 is fabricated.

According to the above-described fabrication method of the semiconductor device, the same advantageous effects as with the first embodiment can be obtained. Further, according to this method, when the $HfW_2O_8$ powder is deposited by evaporation on the NMOS formation region 41 of the semiconductor substrate 11, the temperature of the semiconductor substrate 11 can be decreased to, e.g. about 400° C.

Thus, the implantation profile is hardly affected, and a high-performance device can advantageously be fabricated.

The $HfW_2O_8$ molecules and atoms, which emanate in the form of plume 66 from the target 63, are not simply evaporated, but have a very high dynamic energy (e.g. about $10^{8°}$ C. in terms of temperatures). Thus, even if the composition is the same, the $HfW_2O_8$ layer 61 that is deposited by evaporation on the substrate 11 can have physical properties, such as a higher negative thermal expansion coefficient, which cannot be obtained by other methods.

Furthermore, accordingly to this method, atoms can be stacked in layers, and the controllability can advantageously be improved.

Not only by the laser ablation process but also by a sputtering process using the ceramics target 63 as a target, the $HfW_2O_8$ layer 61, for instance, can be formed on the NMOS formation region 41 on the substrate 11.

In the present embodiment, the $HfW_2O_8$ layer 61 is described as an example of the insulating layer 20. A $ZrW_2O_8$ layer, a $Nb_2O_5$ layer, etc. may be used in place of the $HfW_2O_8$ layer 61. In the case where the ZrW$_2$O$_8$ layer is employed, it has an thermal expansion coefficient of about $-10\times10^{-6}$/K in a range between room temperature and about 1200° C.

Third Embodiment

A semiconductor device according to a third embodiment of the invention is described with reference to FIG. 14. A description of the parts that are common to those in the first embodiment is omitted.

Figure 14:
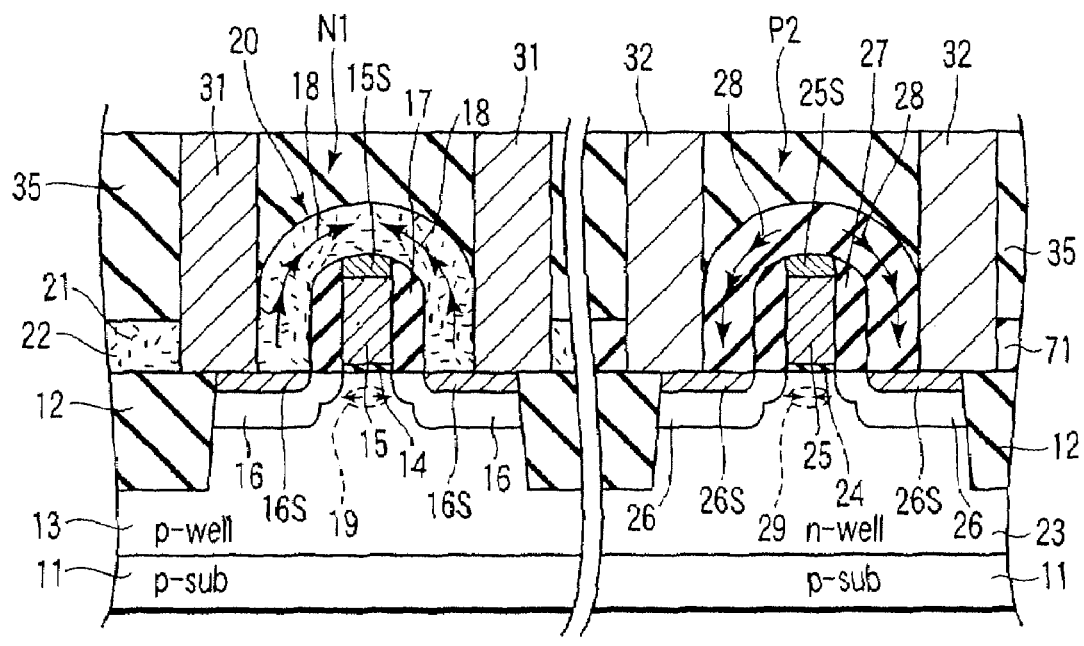
FIG. 14 is a cross-sectional view that shows a semiconductor device according to a third embodiment of the present invention.

As is shown in FIG. 14, a PMOS transistor P2 is provided on the N-well 23. The third embodiment differs from the first embodiment in that an Al$_2$O$_3$ layer 71 is provided as an insulating layer over the silicide layers 26S, spacers 27 and silicide layer 25S. The Al$_2$O$_3$ layer 71 has a positive thermal expansion coefficient.

The fabrication method is substantially the same as that in the first embodiment, so a detailed description is omitted here.

According to the semiconductor device of this embodiment and the fabrication method thereof, the same advantageous effects as in the first embodiment can be obtained. Further, in the semiconductor device of this embodiment, the Al$_2$O$_3$ layer 71 is provided as the insulating layer of the PMOS transistor P2. The magnitude of stress is determined by a product of a thermal expansion coefficient and an elastic coefficient. Although the elastic coefficient of the Al$_2$O$_3$ layer 71 is substantially equal to that of the insulating layer (Si$_3$N$_4$ layer) 30 described in the first embodiment, the thermal expansion coefficient of the former is higher than that of the latter.

Thus, the stress 28 can be made greater than in the semiconductor device of the first embodiment, and the compression stress that is applied to the channel region 29 in the channel length direction can be increased. This embodiment is advantageous in that the mobility of holes can further be enhanced.

Even in the case where an AlN layer, for instance, is substituted for the Al$_2$O$_3$ layer 71, the same advantageous effects as described above can be obtained.

Besides, even in the case where the Al$_2$O$_3$ layer 71 is replaced with, e.g. a pyroceramics layer with a positive thermal expansion coefficient or a glass layer with a positive thermal expansion coefficient, the same advantageous effects as described above can be obtained.

Fourth Embodiment

Figure 15:
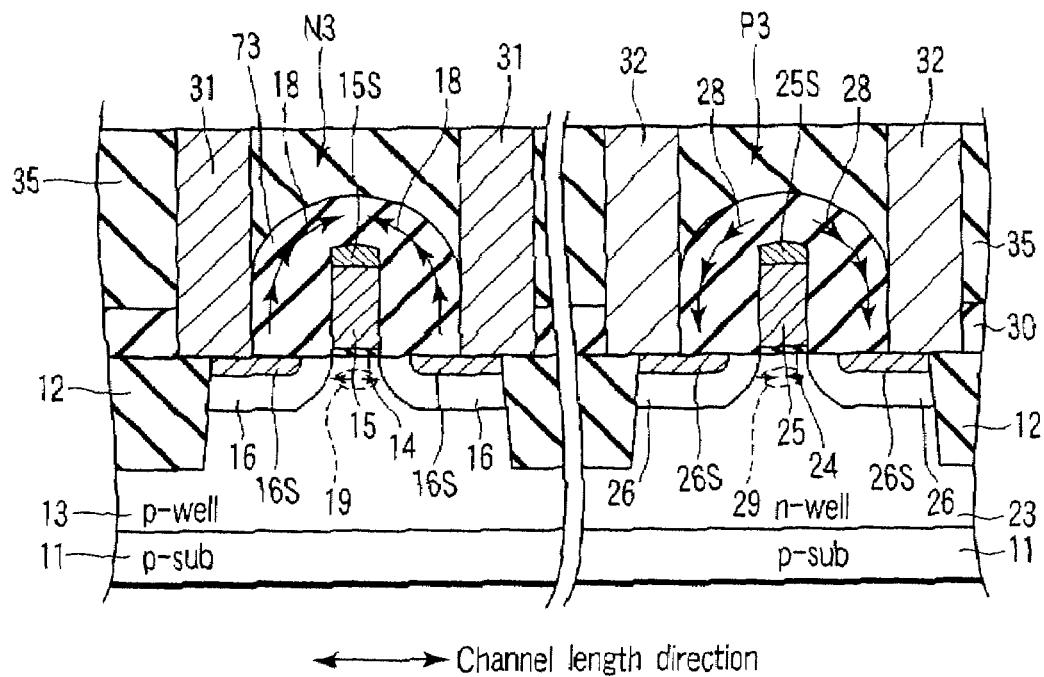
FIG. 15 is a cross-sectional view that shows a semiconductor device according to a fourth embodiment of the present invention.

A semiconductor device according to a fourth embodiment of the invention is described with reference to FIG. 15. FIG. 15 is a cross-sectional view that shows the semiconductor device according to this embodiment. A description of the parts that are common to those in the first embodiment is omitted here.

As is shown in FIG. 15, an NMOS transistor N3 is provided on the P-well 13 in the semiconductor substrate 11, and a PMOS transistor P3 is provided on the N-well 23. The semiconductor device of the fourth embodiment differs from that of the first embodiment in the following respects.

In the transistors N3 and P3, the spacers 17 and 27, which are provided in the semiconductor device of the first embodiment, are integrated in the insulating layers 20 and 30. That is, the spacers are formed as the same layers as the insulating layers 20 and 30 that are used in order to apply stresses.

Further, an insulating layer 73 is provided over the silicide layers 16S of the transistor N3, side walls of the gate electrode 15 and silicide layer 15S. This insulating layer 73 is formed of, for instance, a silicon oxide (SiO$_2$(faujasite)) layer. The insulating layer 73 has a negative thermal expansion coefficient of about $-4\times10^{-6}$/K. Needless to say, the insulating layer 73 may be the above-described pyroceramics 20 with the negative thermal expansion coefficient.

An insulating layer 30 is provided over the silicide layers 26S of the transistor P3, side walls of the gate electrode 25 and silicide layer 25S. This insulating layer 30 is formed of, e.g. Si$_3$N$_4$.

The fabrication method is substantially the same as that in the first embodiment, so a detailed description is omitted here.

According to the semiconductor device of this embodiment and the fabrication method thereof, the same advantageous effects as in the first embodiment can be obtained. Further, in the semiconductor device of this embodiment, the transistors N3 and P3 are not provided with spacers 17 and 27, and the insulating layer 73 and insulating layer 30 are directly provided over the silicide layers of the transistors N3 and P3 and the side walls of the gate electrodes.

As regards the transistor N3, the stress 18, which occurs in accordance with the rise in temperature, can directly be applied without intervention of spacers. Thus, the tensile stress that is applied to the channel region 19 can be increased, and the mobility of electrons can advantageously be enhanced.

As regards the transistor P3, the stress 28 that occurs in accordance with the rise in temperature can directly be applied without intervention of spacers. Thus, the compression stress that is applied to the channel region 29 can be increased, and the mobility of holes can advantageously be enhanced.

Furthermore, since no spacers are provided, the area that would be occupied by spacers can be saved, and this is advantageous for microfabrication.

Fifth Embodiment

Figure 16:
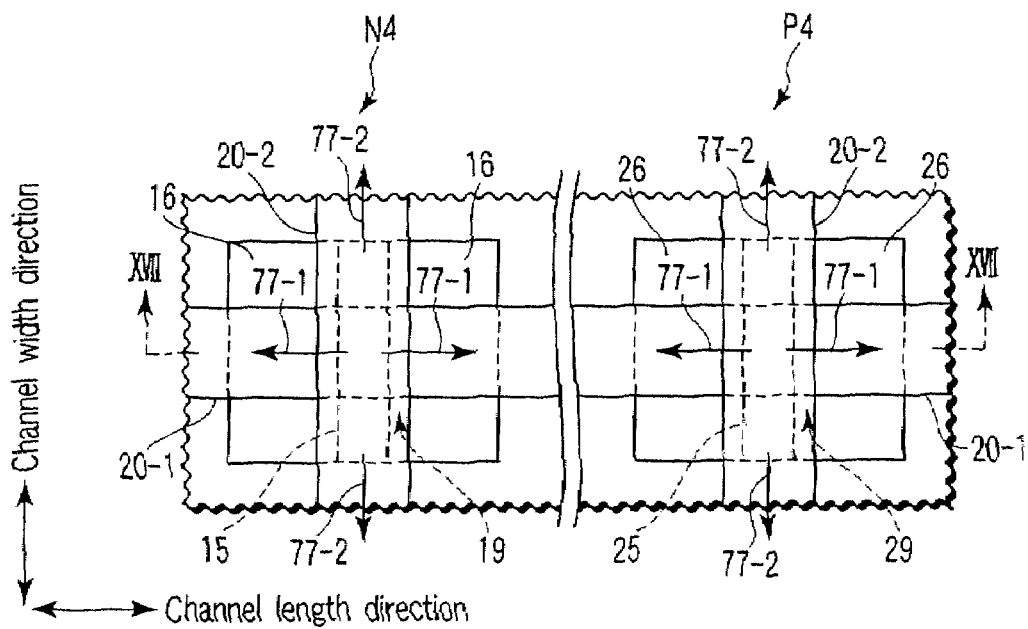
FIG. 16 is a plan view that shows a semiconductor device according to a fifth embodiment of the present invention.
Figure 17:
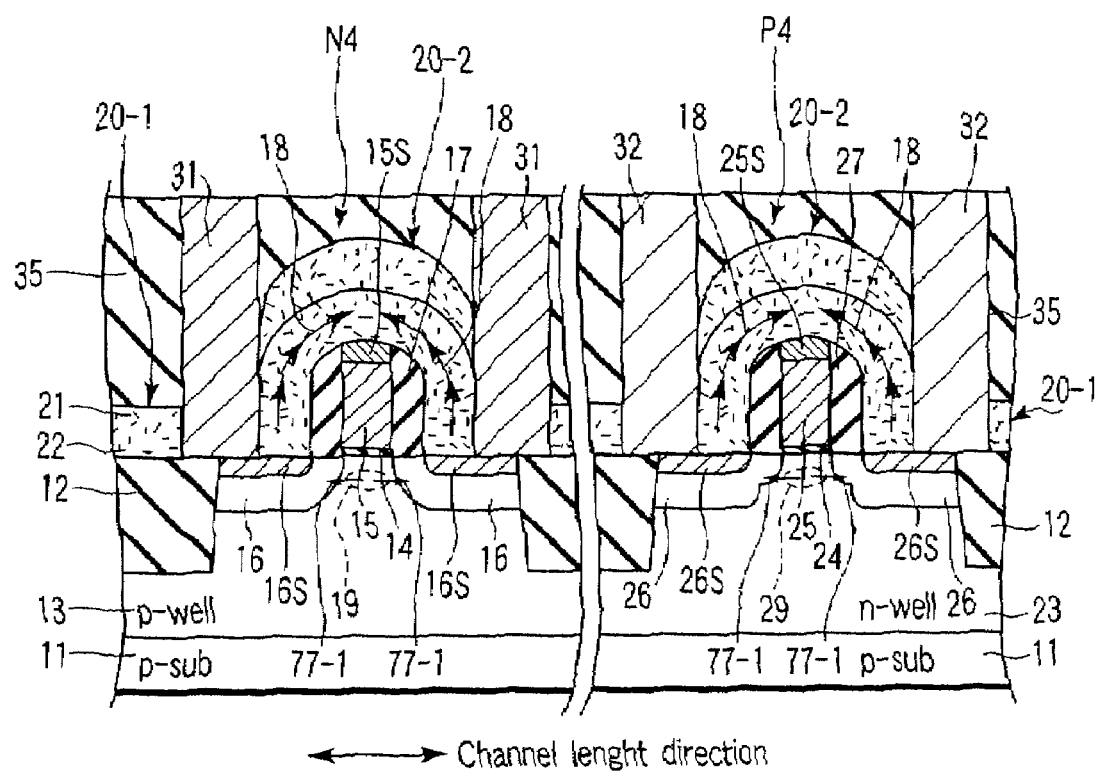
FIG. 17 is a cross-sectional view taken along line XVII-XVII in FIG. 16.

A semiconductor device according to a fifth embodiment of the invention is described with reference to FIG. 16 and FIG. 17. FIG. 16 is a plan view that shows the semiconductor device according to the fifth embodiment. FIG. 17 is a cross-sectional view taken along line XVII-XVII in FIG. 16. A description of the parts that are common to those in the first embodiment is omitted.

As is shown in FIG. 16 and FIG. 17, an NMOS transistor N4 is provided on the P-well 13 in the semiconductor substrate 11, and a PMOS transistor P4 is provided on the N-well 23. The semiconductor device of this embodiment differs from that of the first embodiment in the following respects.

The NMOS transistor N4 includes an insulating layer 20-1 that is continuously provided over the silicide layers 16S, spacers 17 and silicide layer 15S, and an insulating layer 20-2 that is provided on the insulating layer 20-1. The insulating layer 20-2 is disposed in a channel width direction so as to cross the insulating layer 20-1. The insulating layer 20-2 has a similar structure to the insulating layer 20-1. The fabrication method is substantially the same as the method of fabricating the insulating layer 20 in the first embodiment, so a detailed description is omitted here.

The PMOS transistor P4 also includes an insulating layer 20-2 on an insulating layer 20-1. The insulating layer 20-2 is disposed in a channel width direction so as to cross the insulating layer 20-1. The insulating layer 20-2 has a similar structure to the insulating layer 20-1. The fabrication method is substantially the same as that in the first embodiment, so a detailed description is omitted.

According to the semiconductor device of this embodiment and the fabrication method thereof, the same advantageous effects as in the first embodiment can be obtained. Further, in the semiconductor device of this embodiment, each of the NMOS transistor N4 and PMOS transistor P4 includes the insulating layer 20-2 that is disposed in the channel width direction over the insulating layer 20-1 and has a similar structure to the insulating layer 20-1.

Thus, in the NMOS transistor N4, in accordance with the rise in temperature, not only a stress 18 acting along the channel length in a direction from the source/drain regions 16 toward the silicide layer 15S, but also a stress (not shown) acting along the channel width in a direction from the substrate 11 toward the silicide layer 15S can be caused.

Hence, not only a tensile stress 77-1 in the channel length direction but also a tensile stress 77-2 in the channel width direction can be applied to the channel region 19. As a result, the tensile stresses 77-1 and 77-2 can be applied to the channel region 19 at the same time in the vertical two-axis directions, and the mobility of electrons can advantageously be enhanced.

The PMOS transistor P4 also includes the insulating layer 20-2 that is disposed in the channel width direction over the insulating layer 20-1 and has a similar structure to the insulating layer 20-1.

Thus, in accordance with the rise in temperature, not only a stress 18 acting along the channel length in a direction from the source/drain regions 26 toward the silicide layer 25S, but also a stress (not shown) acting along the channel width in a direction from the substrate 11 toward the silicide layer 25S can be caused.

Hence, not only a tensile stress 77-1 in the channel length direction but also a tensile stress 77-2 in the channel width direction can be applied to the channel region 29. As a result, the tensile stresses 77-1 and 77-2 can be applied to the channel region 29 at the same time in the vertical two-axis directions, and the mobility of holes can advantageously be enhanced.

It should suffice if the insulating layer 20-1 and insulating layer 20-2 have negative thermal expansion coefficients, and the insulating layer 20-1 and insulating layer 20-2 may be formed of different materials for fine engineering of stresses 77-1 and 77-2.

In the case where the tensile stresses 77-1 and 77-2 are applied at the same time in the vertical two-axis directions, the mobilities of both electrons and holes can be enhanced. Thus, the mobilities of carriers can advantageously be enhanced at the same time in the NMOS transistor and PMOS transistor.

It is not necessary to additionally provide liner insulating layers for the transistors of the different conductivity types. Therefore, the structure and fabrication process can be made simpler, and the manufacturing cost can be reduced very advantageously.

The method of forming the insulating layers 20-1 and 20-2 is not limited to the method described in the embodiments. Almost all the existing film forming methods, including LPCVD (liquid phase CVD), sputtering and sol-gel methods, are applicable.

The insulating layer 20-1, 20-2 may be in an amorphous state, a pyroceramics state or a polycrystalline state, in accordance with required thermal expansion coefficients. This embodiment is also advantageous in that there are a large number of choices of material structures.

In each of the above-described embodiments, the semiconductor (silicon) substrate 11 is shown by way of example. The invention, however, is also applicable to a semiconductor layer of, e.g. a germanium-based compound semiconductor (SiGe, for instance). In the case of using the semiconductor layer including the compound semiconductor, the mobility of electrons/holes can advantageously be further enhanced.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

The invention claimed is:

1. A semiconductor device comprising:
    an insulated-gate field-effect transistor including a gate electrode that is provided on a semiconductor substrate,
    a source and a drain that are provided in the semiconductor substrate such that the gate electrode is interposed between the source and the drain,
    a first insulating layer that is provided to extend from over the source and the drain to over the gate electrode, and
    a second insulating layer that is provided on the first insulating layer in a direction crossing the first insulating layer.

2. The device according to claim 1, wherein the first insulating layer applies a first stress to a channel region that is formed between the source and the drain, and
    the second insulating layer applies a second stress to the channel region in a direction crossing a direction of the first tensile stress.

3. The device according to claim 2, wherein each of the first stress and the second stress is a tensile stress.

4. The device according to claim 1, wherein the insulated-gate field-effect transistor is one of a P type MOS transistor and an N-type MOS transistor.

5. The device according to claim 1, wherein each of the first and second insulating layers includes at least one of a pyroceramics layer with a negative thermal expansion coefficient, a $HfW_2O_8$ layer, a $ZrW_2O_8$ layer, a $Nb_2O_5$ layer and a $SiO_2$ (faujasite) layer.

6. The device according to claim 5, wherein the pyroceramics layer with the negative thermal expansion coefficient includes an amorphous matrix layer and crystallines that are dispersed in the amorphous matrix layer, and
    a ratio of the crystallines in the pyroceramics layer is greater than a ratio of the amorphous matrix layer in the pyroceramics layer.

7. The device according to claim 1, further comprising:
    a silicide layer that is provided on each of the gate electrode, the source and the drain;
    an interlayer insulation film that is provided to cover the first insulating layer and the second insulating layer; and
    contact wiring lines that are provided to penetrate the interlayer insulating film down to surfaces of the silicide layers on the source and the drain.

8. The device according to claim 1, wherein the second insulating layer applies a stress to a channel region that is formed between the source and the drain.

9. The device according to claim 8, wherein the stress is a tensile stress.

10. The device according to claim 1, wherein the second insulating layers includes at least one of a pyroceramics layer with a negative thermal expansion coefficient, a $HfW_2O_8$ layer, a $ZrW_2O_8$ layer, a $Nb_2O_5$ layer and a $SiO_2$ (faujasite) layer.

11. The device according to claim 10, wherein the pyroceramics layer with the negative thermal expansion coefficient includes an amorphous matrix layer and crystallines that are dispersed in the amorphous matrix layer, and a ratio of the crystallines in the pyroceramics layer is greater than a ratio of the amorphous matrix layer in the pyroceramics layer.

12. A method of manufacturing a semiconductor device comprising:

forming a first and a second insulated-gate field-effect transistors on a semiconductor substrate;

forming a first insulating layer that is provided to extend from over a source and a drain to over a gate electrode of the first insulated-gate field-effect transistor, the first insulating layer applies a tensile stress to a channel region that is formed between the source and the drain, and forming a second insulating layer that is provided to extend from over a source and a drain to over a gate electrode of the second insulated-gate field-effect transistor, the second insulating layer applies a compression stress to a channel region that is foimed between the source and the drain.

13. The method according to claim 12, wherein forming a first insulating layer including forming a silicon oxide film on the first insulated-gate field-effect transistor formation region; and implanting a crystal seeds in the silicon oxide.

14. The method according to claim 13, wherein forming a first insulating layer, further including a first annealing the silicon oxide for a first time period at a first temperature, and forming a amorphous layer from the silicon oxide.

15. The method according to claim 14, wherein forming a first insulating layer, further including a second annealing the amorphous layer for a second time period at a second temperature, and forming crystal nuclei are precipitated in the amorphous layer.

16. The method according to claim 15, wherein forming a first insulating layer, further including a third annealing the amorphous layer for a third time period at a third temperature, and forming crystallines grown from the crystal nuclei, the crystallines are dispersed in the amorphous matrix layer.

17. The method according to claim 16, wherein the second time period is shorter than the third time period.

18. The method according to claim 16, wherein the second temperature is lower than the third temperature.

19. The method according to claim 16, wherein the first temperature is higher than the second and the third temperature.

20. The method according to claim 12, further comprising forming a contact wiring lines that are provided on the source and the drain of the first and the second insulated-gate field-effect transistors.

* * * * *